United States Patent
Song et al.

(10) Patent No.: US 11,146,287 B2
(45) Date of Patent: Oct. 12, 2021

(54) APPARATUS AND METHOD FOR OPTIMIZING PHYSICAL LAYER PARAMETER

(71) Applicant: Samsung Electronics Co., Ltd., Gyeonggi-do (KR)

(72) Inventors: Kee-Bong Song, San Diego, CA (US); Ahmed A. Abotabl, Carlsbad, CA (US); Jung Hyun Bae, San Diego, CA (US)

(73) Assignee: Samsjung Electronics Co., Ltd.

( * ) Notice: Subject to any disclaimer, the term of this patent is extended or adjusted under 35 U.S.C. 154(b) by 131 days.

(21) Appl. No.: 16/688,546

(22) Filed: Nov. 19, 2019

(65) Prior Publication Data
US 2020/0343908 A1   Oct. 29, 2020

Related U.S. Application Data (60) Provisional application No. 62/837,403, filed on Apr. 23, 2019.

(51) Int. Cl.
*H03M 13/01* (2006.01)
*H03M 13/11* (2006.01)
(Continued)

(52) U.S. Cl.
CPC ........ *H03M 13/015* (2013.01); *G06N 3/0454* (2013.01); *G06N 3/063* (2013.01); *H03M 13/1102* (2013.01); *H03M 13/612* (2013.01)

(58) Field of Classification Search
CPC .......... H03M 13/015; H03M 13/1102; H03M 13/612; G06N 3/0454; G06N 3/063
See application file for complete search history.

(56) References Cited

U.S. PATENT DOCUMENTS 10,106,153 B1* 10/2018 Xiao ............... B60W 30/00
10,447,353 B2* 10/2019 Yufit ............... G06N 3/02
(Continued)

FOREIGN PATENT DOCUMENTS

KR   1020130001436   1/2013
KR   1020150030517   3/2015

OTHER PUBLICATIONS

Sutton, Richard S. et al., "Reinforcement Learning: An Introduction", © 2014, 2015, The MIT Press, Cambridge, Massachusetts, London, England, pp. 352.
(Continued)

*Primary Examiner* — Kyle Vallecillo
(74) *Attorney, Agent, or Firm* — The Farrell Law Firm, P.C.

(57) ABSTRACT

An apparatus and method for optimizing a physical layer parameter is provided. According to one embodiment, an apparatus includes a first neural network configured to receive a transmission environment and a block error rate (BLER) and generate a value of a physical layer parameter; a second neural network configured to receive the transmission environment and the BLER and generate a signal to noise ratio (SNR) value; and a processor connected to the first neural network and the second neural network and configured to receive the transmission environment, the generated physical layer parameter, and the generated SNR, and to generate the BLER.

20 Claims, 3 Drawing Sheets

(51) Int. Cl.
*H03M 13/00* (2006.01)
*G06N 3/04* (2006.01)
*G06N 3/063* (2006.01)

(56) References Cited

U.S. PATENT DOCUMENTS

| | | | |
|---|---|---|---|
| 2011/0134751 | A1 | 6/2011 | Balan et al. |
| 2013/0267216 | A1 | 10/2013 | Brisebois et al. |
| 2015/0071190 | A1 | 3/2015 | Lau et al. |
| 2016/0050589 | A1 | 2/2016 | Safavi |
| 2016/0073299 | A1 | 3/2016 | Liang et al. |
| 2016/0284348 | A1* | 9/2016 | Yu .......................... G10L 25/84 |
| 2018/0284742 | A1* | 10/2018 | Cella ....................... G06N 5/046 |
| 2018/0366138 | A1* | 12/2018 | Ramprashad ....... G10L 21/0208 |
| 2019/0043491 | A1* | 2/2019 | Kupryjanow ........... G10L 15/16 |
| 2019/0108445 | A1* | 4/2019 | Huang .................... G06N 3/082 |
| 2020/0043468 | A1* | 2/2020 | Willett ................... G06N 3/082 |
| 2020/0336344 | A1* | 10/2020 | Govea ............... H04L 25/03165 |
| 2021/0111936 | A1* | 4/2021 | Sahin ................... G06N 3/0454 |
| 2021/0142170 | A1* | 5/2021 | Ozcan .................. G02B 5/1866 |

OTHER PUBLICATIONS

3GPP TS 138.212 version 15.2.0 Release 15, ETSI TS 138 V15.2.0 (Jul. 2018), "5G; NR; Multiplexing and channel coding", © ETSI 2018, pp. 102.

Chen, J. et al., "Reduced-complexity decoding of LDPC codes," IEEE Transactions on Communications, vol. 53, No. 8, Aug. 2005, pp. 1288-1299.

Nachmani, Eliya et al., "Deep Learning Methods for Improved Decoding of Linear Codes", IEEE Journal of Selected Topics in Signal Processing, vol. 12, No. 1, Feb. 2018, © 2017 IEEE, pp. 13.

Lugosch, Loren et al., "Neural Offset Min-Sum Decoding", eprint arXiv:1701.05931vs, Jul. 27, 2017, pp. 5.

Sutton, Richard S. et al., "Policy Gradient Methods for Reinforcement Learning with Function Approximation", NIPS'99 Proceedings of the 12th International Conference on Neural Information Processing Systems, Denver, CO, Nov. 29-Dec. 4, 1999, pp. 1057-1063.

Joseph, Samuel et al., Towards Self-Driving Radios: Physical-Layer Control using Deep Reinforcement Learning, HotMobile '19, Feb. 27-28, 2019 Santa Cruz, CA, USA, pp. 69-74.

* cited by examiner

APPARATUS AND METHOD FOR OPTIMIZING PHYSICAL LAYER PARAMETER

PRIORITY

This application claims priority under 35 U.S.C. § 119(e) to a U.S. Provisional Patent Application filed on Apr. 23, 2019 in the United States Patent and Trademark Office and assigned Ser. No. 62/837,403, the entire contents of which are incorporated herein by reference.

FIELD

The present disclosure relates generally to a wireless communication system, and more particularly, to an apparatus and a method for optimizing a physical layer parameter.

BACKGROUND

In a wireless communications system such as a fifth generation (5G) cellular system, optimal closed-form solutions are often available under reasonable assumptions of idealities. However, such optimal solutions frequently incur implementation complexity issues and are susceptible to non-idealities. Approximate solutions designed to address such issues typically involve parameters which cannot be determined in a closed-form, and an exhaustive effort is often required for optimization of such parameters.

In a wireless communication system, minimum-sum (min-sum) decoding of low-density parity-check (LDPC) codes is a low complexity decoding method that may be easily adopted in a hardware implementation. An additive offset to the min-sum decoding, namely, an offset min-sum (OMS) method significantly improves the performance of the min-sum method. The optimal value for this offset is not analytically tractable and might depend on many parameters. The optimal offset value empirically depends on the channel, the transmission conditions, and the code.

LDPC codes are chosen for the shared channel in $3^{rd}$ Generation Partnership Project (3GPP) 5G new-radio (NR) technical specifications. A typical method of decoding LDPC codes is related to belief-propagation that may achieve close to optimal performance if the code is properly designed. Implementing the belief propagation decoding via the sum-product method gives good performance for belief propagation. However, sum-product decoding has a large computational complexity that makes it very difficult to adopt in real implementations. A min-sum method is a low complexity method that approximates sum-product decoding. In an attempt to improve the performance of min-sum decoding, OMS adds an additive term to the min-sum operation. This additive term is optimized offline to improve the performance of the min-sum method.

Optimizing the offset value depends on many parameters in the code such as code-rate, lifting parameter of an underlying protograph, transmission scheme such as the number of antennas, modulation order, and channel type such as an additive white Gaussian noise (AWGN) channel and a fading channel. Unfortunately, the offset value does not have a closed form expression or even a clear behavior with these parameters. Therefore, finding the optimal offset value for all possible scenarios is a very complex problem that requires a significant amount of simulation to determine a block error rate (BLER) at each scenario for all possible offset values in a pre-determined range.

SUMMARY

According to one embodiment, an apparatus is provided. The apparatus includes a first neural network configured to receive a transmission environment and a BLER and generate a value of a physical layer parameter; a second neural network configured to receive the transmission environment and the BLER and generate an SNR value; and a processor connected to the first neural network and the second neural network and configured to receive the transmission environment, the generated physical layer parameter, and the generated SNR, and to generate the BLER.

According to one embodiment, a method is provided. The method includes initializing a first neural network and a second neural network; determining if a mean squared error test ($MSE_{test}$) value is greater than a threshold; if the $MSE_{test}$ value is greater than a threshold, then selecting a batch of transmission environments; generating a physical layer parameter value by the first neural network; generating a signal to noise ratio (SNR) value by the second neural network; simulating a batch of transmission environments by a processor to obtain a BLER; updating the physical layer parameter by the first neural network using the BLER; updating the SNR value by the second neural network using the BLER; and returning to determining if the $MSE_{test}$ value is greater than a threshold; and if the $MSE_{test}$ value is not greater than the threshold, then stopping.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The present disclosure discloses an apparatus and a method for automated physical layer parameter optimization by continuously adapting an SNR and a physical layer parameter to be optimized for various randomly sampled transmission environments. In addition, the present disclosure discloses an RL method that learns an optimal physical layer parameter (e.g., an offset value) under various transmission conditions and code parameters. The present disclosure trains a first neural network (e.g., a policy network) and a second neural network (e.g., an SNR-value network) where the first neural network provides an optimal physical layer parameter and the second neural network provides an operating SNR for a given input state.

The present disclose may be applied to offset optimization for an LDPC decoder. However, the present disclosure is not limited thereto. The present disclosure provides a way to optimize a physical layer parameter and control an SNR, where SNR control guarantees operation at a target BLER, which is desirable for a communication system. The present disclosure also provides a reasonable SNR range for a given transmission environment. The present disclosure learns an optimal value of a physical layer parameter under different transmission environments. In an embodiment, learning an optimal value of a physical layer parameter requires two neural networks, which requires additional processing and storage capabilities.

In addition, the present disclosure discloses a method that extends an actor-critic method to include multiple different states, where a state refers to a given transmission condition and code parameter. To process multiple states, the present disclosure discloses a method of using a neural network structure to learn a policy and a value function of the policy, where a first neural network (e.g., a policy network) provides an optimal value of a physical layer parameter (e.g., an offset value) and a second neural network (e.g., a value network) provides an operating SNR for a given input state. Initial results may be obtained in a simpler environment with ideal channel estimation, etc., using a simulation model, where the simulation model is subsequently incorporated to model more realistic transmission conditions such as real channel estimation and to adapt to any changes in a system by following the latest simulation model updates.

Figure 1:
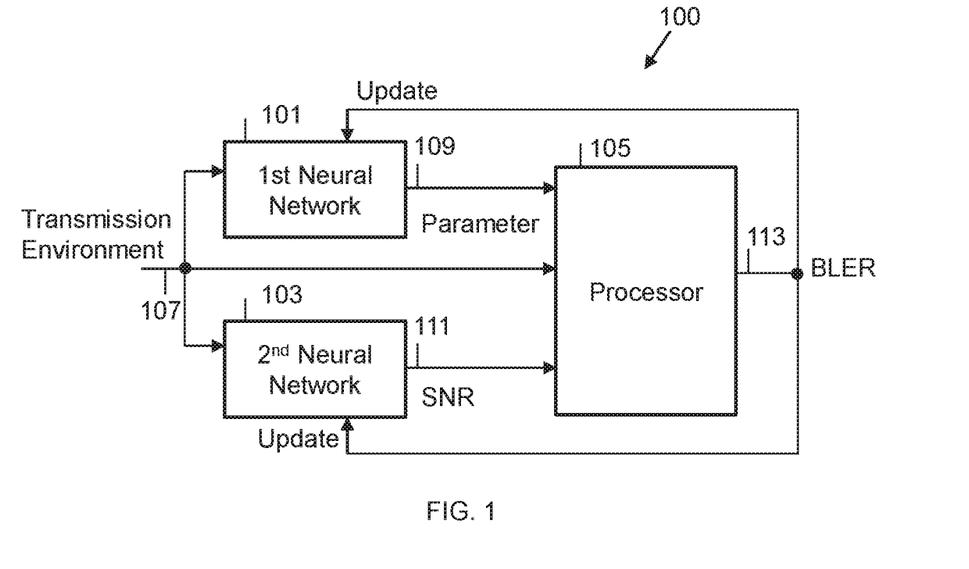
FIG. 1 is a block diagram of an apparatus for determining an optimal physical layer parameter, according to an embodiment.

FIG. 1 is a block diagram of an apparatus 100 for optimizing a physical layer parameter, according to an embodiment.

Referring to FIG. 1, the apparatus 100 includes a first neural network 101, a second neural network 103, and a processor 105.

The first neural network 101 includes a first input 107 for receiving a transmission environment, a second input 113 for receiving a BLER to update the physical layer parameter to be optimized, and an output 109 for outputting a value of the physical layer parameter. In an embodiment, the first neural network 101 may be a policy network. The transmission environment h may include various factors that may affect a physical layer parameter such as channel type ch, transmission rank Rank, modulation order Q, code rate R, a base graph BG, a lifting size Z, a maximum number of decoder iterations $iter_m$, etc. Channel type ch may include an additive white Gaussian noise (AWGN) channel, an extended pedestrian A (EPA) channel, an extended vehicular A (EVA) channel, etc. Modulation order Q may be 2, 4, 6, and 8. Lifting size Z may be a maximum of 384. A base graph BG may be a base graph 1 or a base graph 2. The number of iterations $iter_m$ may be a maximum of 20. The first neural network 101 may be constructed with two hidden layers with 50 nodes each. An RL activation may be used for the hidden layers and a sigmoid activation may be used for an output layer.

The second neural network 103 includes a first input connected to the first input 107 of the first neural network 101 for receiving the transmission environment, a second input connected to the second input 113 of the first neural network 101 for receiving the BLER to update an SNR value, and an output 111 for outputting the SNR value. In an embodiment, the second neural network 103 may be an SNR-value network. In an embodiment, both the first neural network 101 and the second neural network 103 receive a transmission environment h as an input. The second network 103 may be constructed with two hidden layers with 200 nodes each. An activation of the hidden layers may be RL activation while an activation of an output layer may be a linear activation.

The processor 105 includes a first input connected to the first input 107 of the first neural network 101 for receiving the transmission environment, a second input connected to the output 109 of the first neural network 101 for receiving the physical layer parameter, a third input connected to the output 111 of the second neural network 103 for receiving the SNR value, and an output connected to the second input 113 of the first neural network 101 and the second input of the second neural network 103 for outputting the BLER. In an embodiment, the processor 105 may be a simulator. In an embodiment, a physical layer parameter and an SNR for a given BLER may be initially set to arbitrary values. As the processor 105 is trained, the physical layer parameter and the SNR value may be updated until they converge to a local minimum.

In an embodiment, the output of a processor 105 may be used to update both the first neural network 101 and the second neural network 103. The processor 105 may accurately model a transmission and reception procedure under a given transmission environment.

In an embodiment, a mean squared error (MSE) on a test set of transmission environments ($MSE_{test}$) may be evaluated. Parameters may be exhaustively swept as in a conventional method to obtain initial (e.g., genie) parameters on the test set of transmission environments which may be considerably less than the set of all transmission environments.

For example, in order to test the quality of a learned physical layer parameter (e.g., an offset value), a test set may be generated by exhaustively finding an SNR at a target BLER (e.g., 10%) for a given range of the physical layer parameter for 500 different cases with different transmission environments h. The 500 test cases may be generated according to certain rules that guarantee that they are representative and are of practical relevance. The rules may include that there are no two cases that are identical, the channel type ch, transmission rank Rank, and $iter_m$ are sampled uniformly at random for each case and a final check to guarantee an almost equal number of each of the possible values is represented in the test set is performed, and the code rate R, base graph BG, lifting size Z, and modulation order Q are randomly generated while imposing constraints of a 3GPP 5G NR standard (e.g., retransmissions are modeled with low code rate; since low rate codes are allowed in the specification, low rate codes with high modulation order cases cannot simply be ruled out with the previous restriction. Therefore, these cases are ruled out manually since they have very little practical relevance; and large values of lifting size Z are given higher priority due to their practical relevance).

An MSE is calculated as $1/n\Sigma(SNR_t - SNR_r)^2$, where n is a number of states of a test set, where $SNR_t$ is a minimum SNR at a particular BLER, and $SNR_r$ is an output of the second neural network 103.

Figure 2:
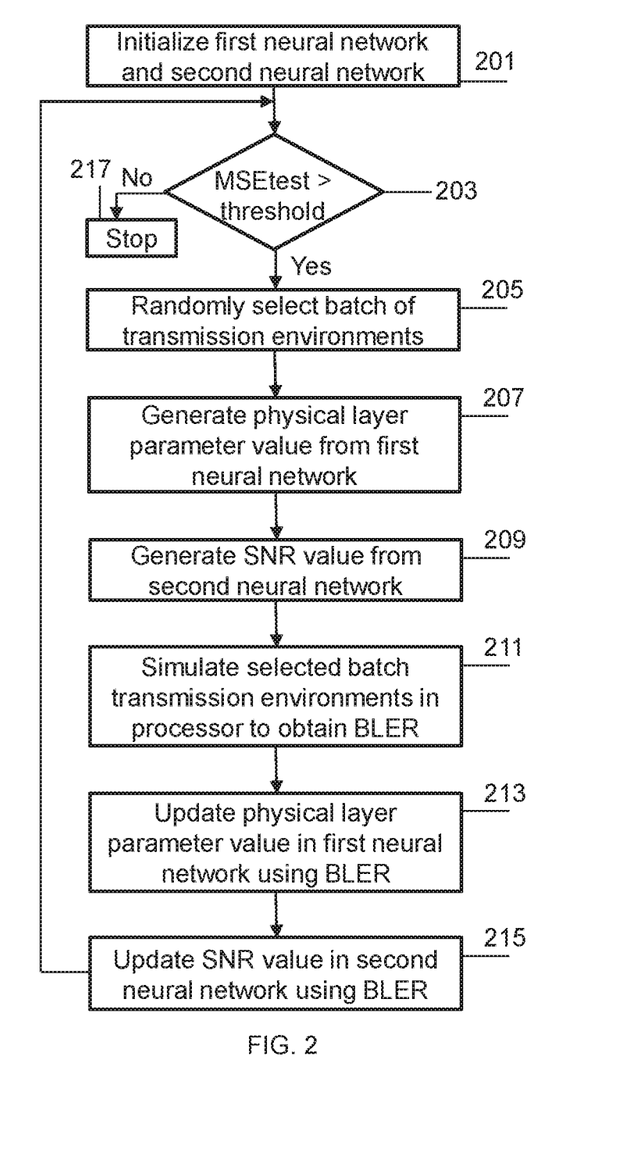
FIG. 2 is a flowchart of a method of determining an optimal physical layer parameter, according to one embodiment.

FIG. 2 is a flowchart of a method of determining an optimal physical layer parameter, according to an embodiment.

Referring to FIG. 2, a first neural network and a second neural network are initialized at 201. In an embodiment, the first neural network may be initialized with an initial value of the physical layer parameter, and the second neural network may be initialized with an initial value of an SNR at a certain BLER.

At 203, it is determined whether an $MSE_{test}$ value is greater than a certain threshold.

If the $MSE_{test}$ value is greater than a certain threshold then the method proceeds to 205. Otherwise, the method stops at 217.

At 205, a batch of transmission environments are randomly selected.

At 207, a value of the physical layer parameter is generated by the first neural network.

At 209, an SNR value is generated by the second neural network.

At 211, the selected batch of transmission environments is simulated in a processor to obtain a BLER for the batch of transmission environments.

At 213, the physical layer parameter value is updated by the first neural network using the BLER obtained at 211.

At 215, the SNR is updated by the second neural network using the BLER obtained at 211 and the method returns to 203.

In an embodiment, the present disclosure discloses a policy gradient method.

Figure 3:
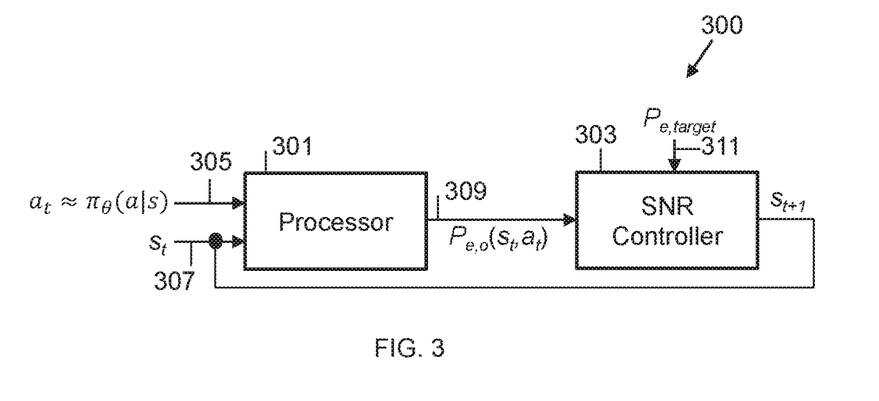
FIG. 3 is a block diagram of an apparatus for performing a Markov decision process (MDP), according to an embodiment.

FIG. 3 is a block diagram of an apparatus 300 for performing a Markov decision process (MDP), in an embodiment. The MDP may be based on an SNR control loop system.

Referring to FIG. 3, the apparatus 300 includes a processor 301, and an SNR controller 303.

The processor 301 includes a first input 305 for receiving an action $a_t$, a second input 307 for receiving a state $s_t$, and an output 309 for providing a sample error output at state $s_t$ due to taking action $a_t$ (e.g., $P_{e,o}(s_t, a_t)$).

The SNR controller 303 includes a first input connected to the output 309 of the processor 301, a second input 311 for receiving a target probability of an error $P_{e,target}$, and an output connected to the second input 307 of the processor 301 for providing a next state $s_{t+1}$.

The state $s_t$ of the MDP at time t may be as in Equation (1) as follows:

$$s_t = \begin{bmatrix} \text{Channel} \\ \text{tx\_rank} \\ \text{mod\_ord} \\ \text{code\_rate} \\ BG \\ \text{lifting size} \\ \text{max\_iterations} \\ SNR_t \end{bmatrix} \quad (1)$$

where all of the members in the state $s_t$ at time t are fixed during the MDP, except for $SNR_t$, which varies with time during the MDP.

The action $a_t$ maybe a physical layer parameter (e.g., an offset value) of an OMS method used at an LDPC decoder of a simulator. A reward $r_t$ at time t is $-SNR_t$. A transition from one state $s_t$ at time t to another state $s_{t+1}$ at time t+1 is performed by the SNR controller 303 as in Table 1 and Equation (2) as follows:

TABLE 1

| $\begin{bmatrix} \text{Channel} \\ \text{tx\_rank} \\ \text{mod\_ord} \\ \text{code\_rate} \\ BG \\ \text{lifting size} \\ \text{max\_iterations} \\ SNR_t \end{bmatrix}$ | $\rightarrow$ | $\begin{bmatrix} \text{Channel} \\ \text{tx\_rank} \\ \text{mod\_ord} \\ \text{code\_rate} \\ BG \\ \text{lifting size} \\ \text{max\_iterations} \\ SNR_{t+1} = SNR_t + \delta(s_t, a_t) \end{bmatrix}$ |
|---|---|---| where $$\delta(s_t, a_t) = \Delta_{SNR}(P_{e,o}(s_t, a_t) - P_{e,target}) \quad (2)$$

$\Delta_{SNR}$ is a fixed constant which mainly controls how much the SNR would increase or decrease depending on an error/no-error event.

A policy $\pi_\theta(a|s) = P_\theta(a|s)$, which is parameterized by $\theta$, determines an action a given a state s. In an embodiment, the policy may be a Gaussian policy, which indicates that a is randomly chosen according to a Gaussian distribution determined by θ.

An average return is as in Equation (3) as follows:

$$\rho(\pi) = \tag{3}$$
$$\rho(\pi, s_0) = \lim_{n\to\infty} \frac{1}{n} E\{r_1 + r_2 + \ldots + r_n | \pi\} = \sum_s d^\pi(s) \sum_a \pi(a|s) R_s^a$$

where $d^\pi(s)$ is a stationary distribution over states under a policy π and $R_s^a$ is an expected reward for taking action a at state s, where $R_s^a$ may be defined as $R_s^a = E\{r_{t+1}|s_t=s, a_t=a\}$. The value of $\rho(\pi)$ depends only on the stationary distribution of the states. Therefore, the dependency on $s_0$ may be removed. In this case, $\rho(\pi)$ depends on the channel and code parameters but, because of the specific environment setup, the dependency on the initial SNR is lost. Therefore, $\rho(\pi)$ depends on the initial state except for $SNR_0$.

The state-action value for the average reward formulation is as in Equation (4) as follows:

$$Q^\pi(s,a) = \sum_{t=1}^\infty E\{r_t - \rho(\pi) | s_0 = s, a_0 = a, \pi\} \tag{4}$$

In order to optimize the policy using gradient methods, the gradient of a cost function may be as in Equation (5) as follows:

$$\nabla_\theta \rho = \tag{5}$$
$$\sum_s d^\pi(s) \sum_a \nabla_\theta \pi_\theta(a|s) Q^\pi(s, a) = E_{d^\pi(s)}\left(\sum_a \nabla_\theta \pi_\theta(a|s) Q^\pi(s, a)\right) =$$
$$E_{s\sim d^\pi(s)}(E_{a\sim \pi_\theta(a|s)}(\nabla_\theta \log(\pi_\theta(a|s)) Q^\pi(s, a)))$$

where the last equality comes from an identity in Equation (6) as follows:

$$\nabla_\theta \pi_\theta(a|s) = \pi_\theta(a|s) \nabla_\theta \log(\pi_\theta(a|s)) \tag{6}$$

A statistical average involved in calculations of $\nabla_\theta \rho$ cannot be obtained since a model is unknown. However, via Monte-Carlo methods, $\nabla_\theta \rho$ may be obtained by sampling a transmission environment and calculating an average of $\nabla_\theta \log(\pi_{\theta(a|s)}) Q^\pi(s,a)$. The Monte-Carlo evaluation of the policy gradient may be to arbitrarily initialize θ and, for each episode, do $\theta \leftarrow \theta + \alpha \nabla_\theta \log(\pi_\theta(a|s)) v_t$ for t=1 to T−1, and return θ, where $v_t$ is an unbiased sample of $Q^\pi(s,a)$.

One main problem with this approach is that a policy gradient with Monte-Carlo suffers from large variance. The present disclosure discloses two methods (e.g., a baseline method and an actor-critic method) below.

In the baseline method, subtracting a baseline from $Q^\pi(s,a)$ as $Q^\pi(s,a)-f(s)$ may reduce the variance without changing the expectation as can be seen in Equation (7) as follows:

$$\nabla_\theta \rho = E_{s\sim d^\pi(s)}\left(\sum_a \nabla_\theta \pi_\theta(a|s) Q^\pi(s, a)\right) \tag{7}$$
$$= E_{s\sim d^\pi(s)}\left(\sum_a \nabla_\theta \pi_\theta(a|s)[Q^\pi(s, a) - f(s)]\right) +$$
$$E_{s\sim d^\pi(s)}\left(\sum_a \nabla_\theta \pi_\theta(a|s) f(s)\right) =$$

$$E_{s\sim d^\pi(s)}\left(\sum_a \nabla_\theta \pi_\theta(a|s) A^\pi(s, a)\right),$$

where $A^\pi(s,a) = Q^\pi(s,a) - f(s)$

The last equality comes from Equation (8) as follows:

$$E_{s\sim d^\pi(s)}\left(\sum_a \nabla_\theta \pi_\theta(a|s) f(s)\right) = E_{s\sim d^\pi(s)}\left(f(s) \sum_a \nabla_\theta \pi_\theta(a|s)\right) = \tag{8}$$
$$E_{s\sim d^\pi(s)}\left(f(s) \nabla_\theta \sum_a \pi_\theta(a|s)\right) = E_{s\sim d^\pi(s)}(f(s) \nabla_\theta 1) = 0$$

In the actor-critic method, choosing the baseline function as the value function $V^\pi(s) = \sum_a \pi_{\theta(a|s)} Q^\pi(s,a)$ leads to Equation (9) as follows:

$$A^{90}(s,a) = Q^\pi(s,a) - V^\pi(s) \tag{9}$$

Specifically choosing the value function is a good idea because the advantage $A^\pi(s,a)$ indicates distance from an average.

The gradient of the average return is as in Equation (10) as follows:

$$\nabla_\theta \rho = E_{s\sim d^\pi(s)}(E_{a\sim \pi_\theta(a|s)}(\nabla_\theta \log(\pi_\theta(a|s)) A^\pi(s,a)) \tag{10}$$

The actor-critic method requires estimating an advantage function which is parameterized by w and is referred to as $A_w^\pi(s,a)$.

Similar to the Monte-Carlo policy gradient, a gradient of the actor-critic method may be evaluated on a sample by sample basis as follows in Table 2 below.

TABLE 2

Initialize s, θ
Sample a~$\pi_\theta$(a|s)
For each step do
   a. Sample reward r, sample transition s`
   b. Sample action a`~$\pi_\theta$(a`|s`)
   c. θ ← θ + α $\nabla_\theta$ log($\pi_\theta$(a|s)) $A_w^\pi$(s, a)
   d. w ← w + γ $\nabla_w A_w^\pi$(s, a)
End A policy gradient may be approximated by calculating $A^\pi(s,a)$ as in Equation (11) as follows:

$$A^\pi(s, a) = \tag{11}$$
$$Q^\pi(s, a) - V^\pi(s) = \sum_{t=1}^\infty E\{r_t - \rho(\pi) | s_0 = s, a_0 = a, \pi\} - V^\pi(s) =$$
$$R_s^a - \rho(\pi) + \sum_{s'} P_{ss'}^a V^\pi(s') - V^\pi(s)$$

using samples from Equation (12) as follows:

$$A^{90}(s,a) \approx r(s,a) - \rho(\pi) + V^\pi(s') - V^\pi(s) \tag{12}$$

where $s = \rho(\pi)$, $r(s,a) = \rho(\pi) + \delta(s,a)$, and $V^{90}(s) = 0$.

Consequently, $A^\pi(s,a)$ is as in Equation (13) as follows:

$$A^\pi(s,a) \approx \delta(s,a) + V^\pi(s') \tag{13}$$

Under the conditions that (1) $P_e(s,\pi)$ is a monotonically decreasing function of SNR (dB), s; (2) $P_e(s^*,\pi) = P_{e,target}$; $P_e(s,\pi)$ is concave for $s < s_L$, linear in the range $[s_L, s_R]$ and convex for $s > s_R$; and (3) $0 < \Delta_{SNR} < 1/|P'_e(s^*,\pi)|$, where $s^* = \rho(\pi)$, a small enough value of $\Delta_{SNR}$ can be determined, which ensures that $V^\pi(s')$ always has the same sign as $\delta(s,a)$, $A^\pi(s,a) \approx \delta(s,a)$.

$\nabla_\theta \log(\pi_\theta(a|s))$ is calculated as in Equation (14) as follows:

$$\nabla_\theta \log(\pi_\theta(a|s)) = \frac{(a-\theta)}{\sigma^2} = \alpha'(a-\theta) \qquad (14)$$

where, under a Gaussian policy, $$\pi_\theta(a|s) = \beta\exp\left(-\frac{(a-\theta)^2}{2\sigma^2}\right).$$

$A^\pi(s,a)$ and $\nabla_\theta \log (\pi_\theta(a|s))$ may be combined to obtain $\nabla_\theta \rho$ as in Equation (15) as follows:

$$\nabla_\theta \rho \approx \alpha'(a-\theta)\delta(s,a) \qquad (15)$$

Using this simplification, the value function is dropped such that only an estimate for $\rho(\pi)$ is determined. In the present disclosure, a value network may refer to a network that takes the channel parameters as an input and outputs $\rho(\pi)$.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
   a first neural network configured to receive a transmission environment and a block error rate (BLER) and generate a value of a physical layer parameter;
   a second neural network configured to receive the transmission environment and the BLER and generate a signal to noise ratio (SNR) value; and
   a processor connected to the first neural network and the second neural network and configured to receive the transmission environment, the generated physical layer parameter, and the generated SNR value, and to generate the BLER.

2. The apparatus of claim 1, wherein the first neural network and the second neural network are each further configured to initialize the first neural network and the second neural network, respectively, using a simulation model.

3. The apparatus of claim 1, wherein the processor is further configured to determine a mean squared error test ($MSE_{test}$), wherein $MSE_{test}$ is an MSE on a test set of transmission environments, wherein $$MSE = \frac{1}{n}\sum (SNR_t - SNR_r)^2,$$

wherein n is a number of states of the test set of transmission environments, wherein $SNR_t$ is a minimum SNR value at a particular BLER, and wherein $SNR_r$ is an output of the second neural network.

4. The apparatus of claim 1, further comprising a low-density parity-check (LDPC) decoder, wherein the physical layer parameter is an offset value for the LDPC decoder.

5. The apparatus of claim 1, wherein the transmission environment includes at least one of a channel type, a transmission rank, a modulation order, a code rate, a base graph, a lifting size, or a maximum number of decoder iterations.

6. The apparatus of claim 5, wherein the channel type includes an additive white Gaussian noise (AWGN) channel, an extended pedestrian A (EPA) channel, or an extended vehicular A (EVA) channel; the modulation order is 2, 4, 6, or 8, the lifting size is a maximum of 384, the base graph is a base graph 1 or a base graph 2, and the maximum number of decoder iterations is 20.

7. The apparatus of claim 1, wherein the first neural network includes a plurality of hidden layers and an output layer, wherein reinforcement learning (RL) activation is used for the plurality of hidden layers.

8. The apparatus of claim 7, wherein the output layer uses sigmoid activation.

9. The apparatus of claim 7, wherein the output layer uses linear activation.

10. The apparatus of claim 1, wherein the transmission environment is selected so that no two transmission environments in a batch of transmission environments are identical; a channel type, a transmission rank, and a maximum number of decoder iterations are sampled uniformly at random for each batch of transmission environments; and a code rate, a base graph, a lifting size, and a modulation order are randomly generated while imposing constraints of a new radio (NR) standard.

11. A method, comprising:
    initializing a first neural network and a second neural network;
    determining if a mean squared error test ($MSE_{test}$) value is greater than a threshold;
    if the $MSE_{test}$ value is greater than a threshold, then
        selecting a batch of transmission environments;
        generating a physical layer parameter value by the first neural network;
        generating a signal to noise ratio (SNR) value by the second neural network;
        simulating a batch of transmission environments by a processor to obtain a block error rate (BLER);

updating the physical layer parameter value by the first neural network using the BLER;
updating the SNR value by the second neural network using the BLER; and
returning to determining if the $MSE_{test}$ value is greater than a threshold; and if the $MSE_{test}$ value is not greater than the threshold, then
stopping.

12. The method of claim 11, wherein initializing the first neural network and the second neural network comprises initializing the first neural network and the second neural network using a simulation model.

13. The method of claim 11, wherein $MSE_{test}$ is an MSE on a test set of transmission environments, wherein $$MSE = \frac{1}{n}\sum (SNR_t - SNR_r)^2,$$

wherein n is a number of states of the test set of transmission environments, wherein $SNR_t$ is a minimum SNR value at a particular BLER, and wherein $SNR_r$ is an output of the second neural network.

14. The method of claim 11, wherein the physical layer parameter value is an offset value for a low-density parity-check (LDPC) decoder.

15. The method of claim 11, wherein a transmission environment in the batch of transmission environments includes at least one of a channel type, a transmission rank, a modulation order, a code rate, a base graph, a lifting size, or a maximum number of decoder iterations.

16. The method of claim 15, wherein the channel type includes an additive white Gaussian noise (AWGN) channel, an extended pedestrian A (EPA) channel, or an extended vehicular A (EVA) channel; the modulation order is 2, 4, 6, or 8, the lifting size is a maximum of 384, the base graph is a base graph 1 or a base graph 2, and the maximum number of decoder iterations is 20.

17. The method of claim 11, wherein the first neural network includes a plurality of hidden layers and an output layer, wherein reinforcement learning (RL) activation is used for the plurality of hidden layers.

18. The method of claim 17, wherein the output layer uses sigmoid activation.

19. The method of claim 17, wherein the output layer user linear activation.

20. The method of claim 11, wherein selecting the batch of transmission environments comprises selecting the batch of transmission environments so that no two batches of transmission environments are identical; a channel type, a transmission rank, and a maximum number of decoder iterations are sampled uniformly at random for each batch; and a code rate, a base graph, a lifting size, and a modulation order are randomly generated while imposing constraints of a new radio (NR) standard.

* * * * *